United States Patent
Wang (10) Patent No.: US 7,867,888 B2
(45) Date of Patent: Jan. 11, 2011

(54) FLIP-CHIP PACKAGE SUBSTRATE AND A METHOD FOR FABRICATING THE SAME

(75) Inventor: Hsien-Shou Wang, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 595 days.

(21) Appl. No.: 11/808,028

(22) Filed: Jun. 6, 2007

(65) Prior Publication Data

US 2008/0029894 A1 Feb. 7, 2008

(51) Int. Cl.
*H01L 23/532* (2006.01)
*H01L 21/44* (2006.01)

(52) U.S. Cl. .............. 438/613; 257/762; 257/E23.019; 257/E23.161; 257/E21.476; 174/261; 174/268

(58) Field of Classification Search ................. 257/762, 257/E23.019, E23.161, E23.476, E21.476; 174/261, 268; 438/613
See application file for complete search history.

(56) References Cited

U.S. PATENT DOCUMENTS

| | | | |
|---|---|---|---|
| 6,521,845 B1 * | 2/2003 | Barrow | 174/260 |
| 6,921,977 B2 * | 7/2005 | Shimizu et al. | 257/758 |
| 2003/0047797 A1 * | 3/2003 | Kuan et al. | 257/678 |
| 2005/0037601 A1 * | 2/2005 | Hsu et al. | 438/612 |
| 2005/0167830 A1 * | 8/2005 | Chang et al. | 257/737 |
| 2006/0121719 A1 * | 6/2006 | Nakamura et al. | 438/613 |
| 2006/0223236 A1 * | 10/2006 | Nomura et al. | 438/121 |

* cited by examiner

*Primary Examiner*—Wael M Fahmy
*Assistant Examiner*—Peniel M Gumedzoe
(74) *Attorney, Agent, or Firm*—Bacon & Thomas, PLLC (57) ABSTRACT

The present invention provides a flip-chip package substrate and a method for fabricating a flip-chip package substrate comprising a circuit build-up structure, which comprises at least a dielectric layer and at least a circuit layer, wherein each dielectric layer comprises a first surface and a second surface, plural vias are formed in the first surface, the circuit layer is formed on the first surface and in the vias to electrically connect to another circuit layer disposed under the dielectric layer; a metal layer embedded in the exposed second surface of the circuit build-up structure without protruding the exposed second surface and connected to the circuit layer; and two solder masks disposed on the exposed first surface and the exposed second surface of the circuit build-up structure, wherein the solder masks have plural openings to separately expose part of the circuit layer and the metal layer functioning as conductive pads.

7 Claims, 6 Drawing Sheets

FLIP-CHIP PACKAGE SUBSTRATE AND A METHOD FOR FABRICATING THE SAME

BACKGROUND OF THE INVENTION

1. Field of the Invention

The present invention relates to a flip-chip package substrate and a method for fabricating the same, more particularly, to a structure of a flip chip substrate without plating through holes having improved density of circuit layout and a manufacturing method of a flip-chip package substrate to simplify the process.

2. Description of Related Art

In the development of electronics, the design trend of electronic devices is towards to multifunction and high-performance. Thus, high-density integration and miniaturization are necessary for a semiconductor package structure. On the ground aforementioned, the doublelayer circuit boards providing active components, passive components, and circuit connection, are being replaced by the multilayer circuit boards. The area of circuit layout on the circuit board increases in a restricted space by interlayer connection when meeting the requirement of high-density integration.

In the conventional semiconductor device structure, a semiconductor chip is attached on top of a substrate and then processed in wire bonding or a chip is connected to a substrate by a flip chip package. Further, solder balls are disposed on the side of the substrate that does not have semiconductor chip attached thereto so as to connect with external electronic devices. Although more connecting ends are provided, the performance of electronic devices cannot be enhanced but is in fact restricted, owing to the over-long path of circuit and resulting high resistance for high frequency operation.

Figure 1A:
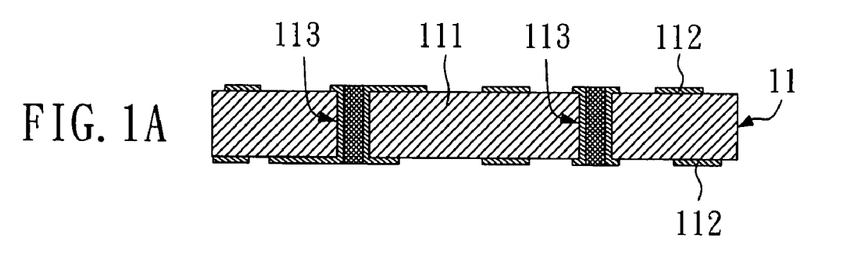
FIGS. 1A to 1E are cross-section views of a conventional method of manufacturing a flip-chip package substrate having a core-board.
Figure 1B:
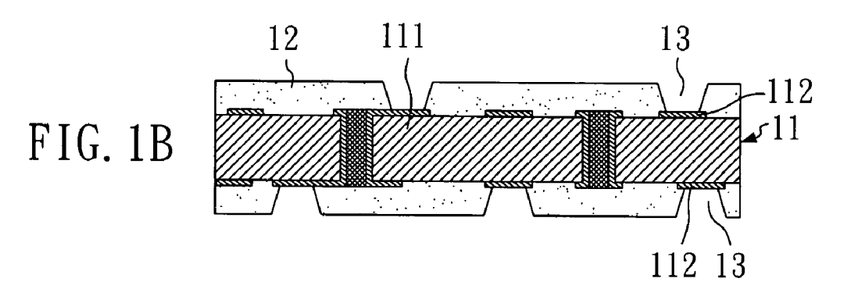
Figure 1C:
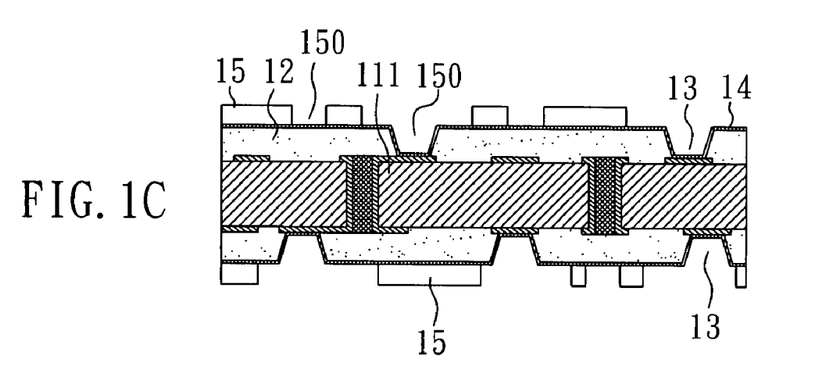
Figure 1D:
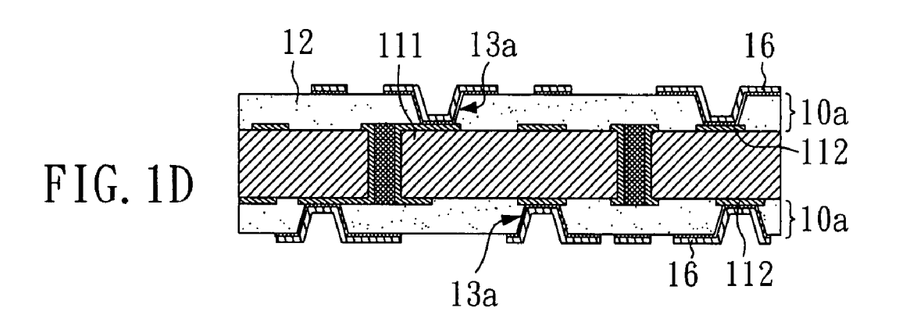
Figure 1E:
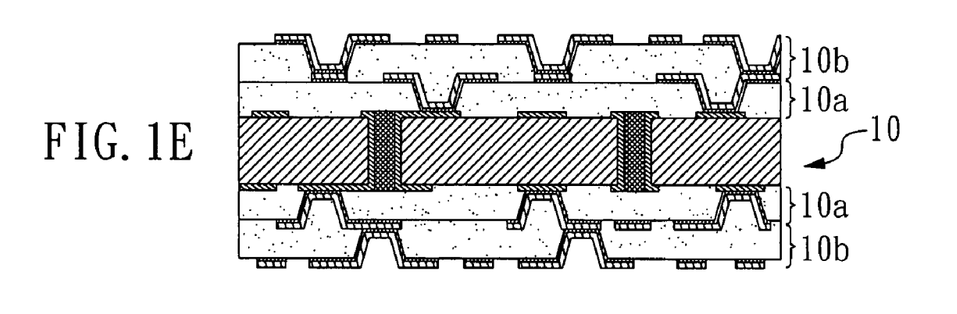

In the conventional method for manufacturing a structure of a package substrate, a core-board is provided first, and then the structure of the inner circuit layer is accomplished by drilling, electroplating, plugging holes, forming circuits and so on. Subsequently, a multilayer package substrate is accomplished by circuit build-up layer technology. One of methods for manufacturing a multilayer circuit board of circuit build-up layers is shown in FIGS. 1A to 1E. As shown in FIG. 1A, a core-board 11, comprising a core layer 111 of determined thickness and a first circuit layer 112 on the surface of the core layer 111, is provided first. At the same time, plural plating through holes 113 are formed in the core layer 111. Accordingly, the first circuit layers 112 on the top surface and the back surface of the core layer 111 are connected to each other through the plating through holes 113. As shown in FIG. 1B, a circuit build-up process is performed on the core-board 11 to dispose a dielectric layer 12 on the surface of the core-board 11, wherein plural vias 13 are formed in the dielectric layer 12 to connect with the first circuit layer 112. As shown in FIG. 1C, a conductive layer 14 is formed on the surface of the dielectric layer 12 by electroless plating or sputtering, and a resistive layer 15 is formed on the surface of the conductive layer 14. The resistive layer 15 is patterned and plural openings 150 are formed to expose the part surface of the conductive layer 14. As shown in FIG. 1D, a patterned second circuit layer 16 and a conductive blind via 13a are formed, wherein the second circuit layer 16 can be connected to the first circuit layer 112 through the conductive via 13a. Then, the resistive layer 15 and the partial conductive layer 14 covered by the resistive layer are removed. Thereby, a first circuit build-up layer 10a is accomplished. As shown in 1E, a second circuit build-up layer 10b can be formed on the surface of the first circuit build-up layer 10a by the above process and a multilayer package substrate 10 is accomplished.

In the aforementioned method of providing a core-board, then accomplishing the inner structure by drilling, electroplating, plugging holes, forming the circuit and so on, and subsequently, realizing a multilayer package substrate by circuit build-up layer technology, some drawbacks exist such as low density of circuit layout, excessive layers, long circuit path, and high resistance. Thereby, the electric property is poor in high frequency operation; in addition, the excessive layers result in the complex manufacturing processes and high manufacturing cost.

SUMMARY OF THE INVENTION

In order to resolve the aforementioned disadvantages, the present invention provides a method for fabricating a flip-chip package substrate, comprising: providing a carrier plate; forming a patterned resistive layer having plural openings therein on the carrier plate; forming plural non-penetrating cavities corresponding to the openings on the surface of the carrier plate, and the carrier plate therefore has plural protrusions and a base; removing the patterned resistive layer; forming a circuit build-up structure on the surface of the carrier plate and, wherein the circuit build-up structure comprises at least a dielectric layer and at least a circuit layer; forming a resistive layer on the surface of the circuit build-up structure; removing the base of the carrier plate; removing the resistive layer to form an incomplete flip-chip package substrate for receiving a semiconductor chip; and respectively forming a solder mask on the upper and the lower surfaces of the flip-chip package substrate, and forming plural openings in the solder mask to expose part currents of the circuit build-up structure to function as conductive pads and the plural protrusions to function as conductive pads on the other surface of the circuit build-up structure. Thereby, the present invention provides a method for fabricating a flip-chip package substrate to enhance the density of circuit layout, reduce the length and the resistance of wires so as to improve the high-frequency operation. Moreover, the steps of the method are simple, and the stacks formed in this method are lessened so as to reduce the manufacturing cost of the flip-chip package substrate relative to prior art.

According to the aforementioned method for fabricating the flip-chip package substrate of the present invention, preferably, plural solder bumps are formed on the conductive pads on the upper and the lower surfaces of the aforementioned circuit build-up structure.

The material of the solder bumps of the present invention is not limited. Preferably, the material of the solder bumps is selected from the group consisting of copper, tin, lead, silver, nickel, gold, platinum, and an alloy thereof.

The process for forming the solder bumps of the present invention is not limited. Preferably, the process is electroplating or printing.

Preferably, before the formation of the solder bumps, metal posts and then the solder bumps are selectively formed on the conductive pads on the upper and the lower surfaces of the aforementioned circuit build-up structure by electroplating.

Preferably, a remaining component is individually disposed around the periphery of the solder mask to inhibit the bend of the substrate.

Preferably, the material of the metal posts is selected from the group consisting of copper, nickel, chromium, titanium, a copper/chromium alloy, and a tin/lead alloy. More preferably, the material of the metal posts is copper.

The process for forming the metal posts is not limited. Preferably, the process is electroplating.

The material of the carrier plate of the present invention is not limited. Preferably, the material of the carrier plate is copper.

The process for forming the first openings is not limited. Preferably, the process is exposure and development.

The process for forming the non-penetrating cavities is not limited. Preferably, the process is etching.

The process for removing the base of the carrier plate is not limited. Preferably, the process is etching.

The process for forming at least one circuit build-up structure of the present invention is not limited. Preferably, a dielectric layer is formed on the carrier plate; plural vias are formed in the dielectric layer and a conductive layer is formed on the surface of the dielectric layer and the vias; a patterned resistive layer is formed on the conductive layer and the patterned resistive layer has plural openings therein corresponding to the vias of the dielectric layer; an electroplated metal layer is formed in the openings; and the patterned resistive layer and the conductive layer covered by the patterned resistive layer are removed.

The material of the dielectric layer is not limited. Preferably, the material of the dielectric layer is selected from the group consisting of non-photosensitive organic resin, a photosensitive organic resin (e.g. ABF (Ajinomoto Build-up Film), BCB (Benzocyclo-buthene), LCP (Liquid Crystal Polymer), PI (Poly-imide), PPE (Poly(phenylene ether)), PTFE (Poly (tetra-fluoro-ethylene)), FR4, FR5, BT (Bismaleimide Triazine), or Aramide), and a mixture of epoxy resin and fiber glass.

The process for forming the vias of the dielectric layer is not limited. Preferably, the process is laser-ablation, or exposure and development.

The material of the conductive layer is not limited. Preferably, the material of the conductive layer is selected from the group consisting of copper, tin, nickel, chromium, titanium, a copper/chromium alloy, and a tin/lead alloy.

The process for forming the conductive layer is not limited. Preferably, the process is sputtering or electroless plating.

The material of the conductive layer is not limited. Preferably, the material of the conductive layer is a conductive polymer, and the process for forming the conductive layer is spin coating, ink-jet printing, screen-printing, or impression.

The material of the conductive layer is not limited. Preferably, the material of the conductive layer is polyacetylene, polyaniline, or organo-sulfur polymer.

The material of the electroplated metal layer is not limited. Preferably, the material of the electroplated metal layer is copper.

In order to enhance the density of circuit layout, the length and the resistance of wires can be reduced so as to improve the high-frequency operation. Moreover, simplifies the steps of the method and the stacks formed in this method to achieve a low manufacturing cost of the flip-chip package substrate. The present invention provides a flip-chip package substrate, which comprises at least a dielectric layer and at least a circuit layer, wherein each dielectric layer comprises a first surface and a second surface, plural vias are formed in the first surface, the circuit layer is formed on the first surface and in the vias to electrically connect to another circuit layer disposed under the dielectric layer; a metal layer embedded in the exposed second surface of the circuit build-up structure without protruding the exposed second surface and electrically connected to the circuit layer; and two solder masks disposed on the exposed first surface and the exposed second surface of the circuit build-up structure, wherein the solder masks have plural openings to separately expose part of the circuit layer and the metal layer functioning as conductive pads.

Moreover, the flip-chip package substrate of the present invention can selectively further comprise plural solder bumps disposed on the exposed circuit layer of the solder mask and the metal layer. The material of the solder bumps of the present invention is not limited. Preferably, the material of the solder bumps is selected from the group consisting of copper, tin, lead, silver, nickel, gold, platinum, and an alloy thereof.

Additionally, the flip-chip package substrate of the present invention can selectively further comprise plural solder bumps and plural metal posts disposed on the exposed circuit layer of the solder mask and the metal layer. The solder bumps are disposed on the metal posts. The material of the metal posts of the present invention is not limited. Preferably, the material of the metal posts is selected from the group consisting of copper, tin, lead, silver, nickel, gold, platinum, and an alloy thereof.

The flip-chip package substrate of the present invention can selectively further comprise retaining components disposed around the periphery of the solder mask respectively to inhibit the bend of the substrate.

The material of the metal layer of the present invention is not limited. Preferably, the material of the metal layer is copper.

In the flip-chip package substrate of the present invention, the circuit layer of the package substrate comprises an electroplated metal layer and a conductive layer. The material of the electroplated metal layer is not limited. Preferably, the material of the electroplated metal layer is copper. The material of the conductive layer is not limited. Preferably, the material of the conductive layer is selected from the group consisting of copper, tin, nickel, chromium, titanium, a copper/chromium alloy, and a tin/lead alloy, and selected from the group consisting of polyacetylene, polyaniline, and organo-sulfur polymer.

The material of the solder mask of the present invention is not limited. Preferably, the material of the solder mask is green paint or black paint.

Other objects, advantages, and novel features of the invention will become more apparent from the following detailed description when taken in conjunction with the accompanying drawings.

DETAILED DESCRIPTION OF THE PREFERRED EMBODIMENT

Embodiment 1

Figure 2A:
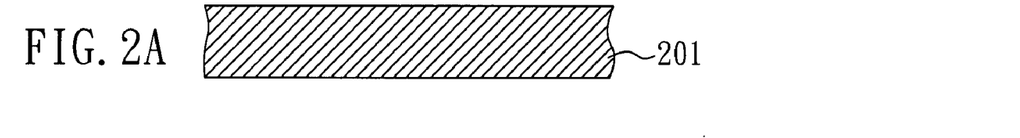
FIGS. 2A to 2O are cross-section views of manufacturing a flip-chip package substrate of a preferred embodiment.
Figure 2B:
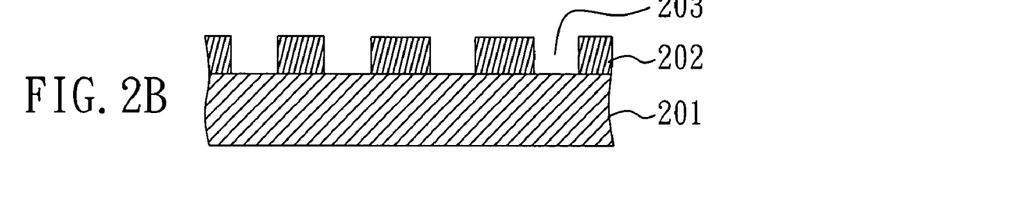
Figure 2C:
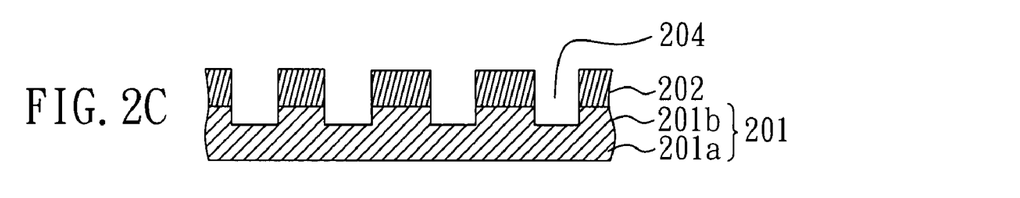
Figure 2D:
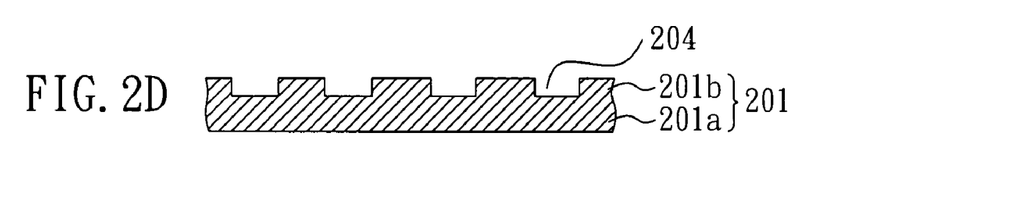
Figure 2E:
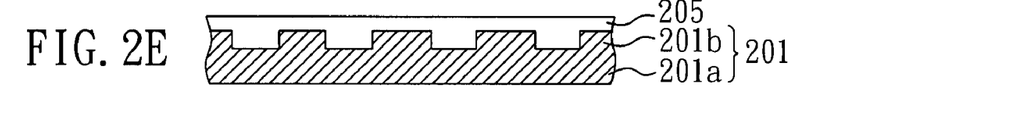
Figure 2F:
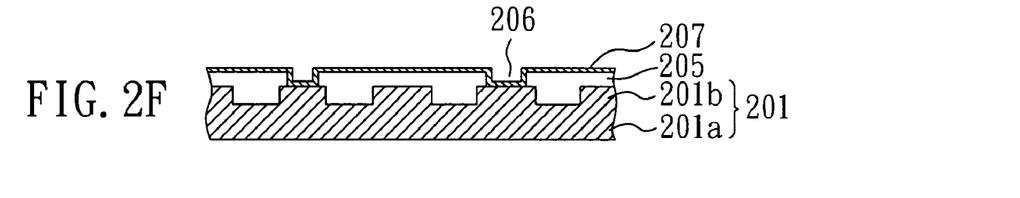
Figure 2G:
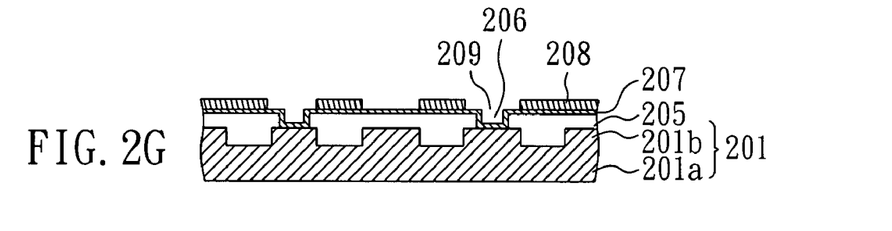
Figure 2H:
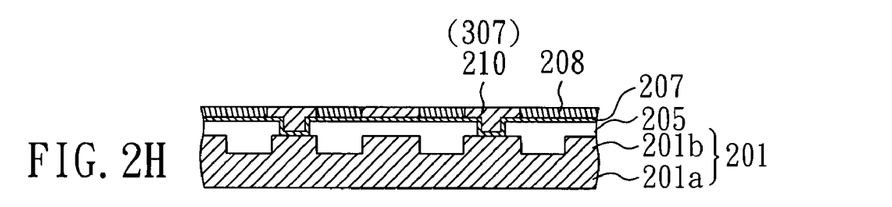
Figure 2I:
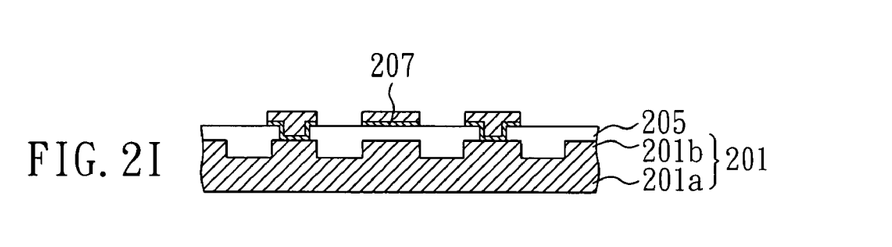
Figure 2J:
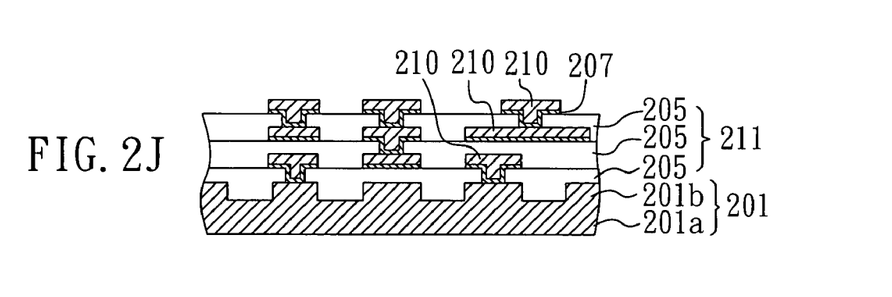
Figure 2K:
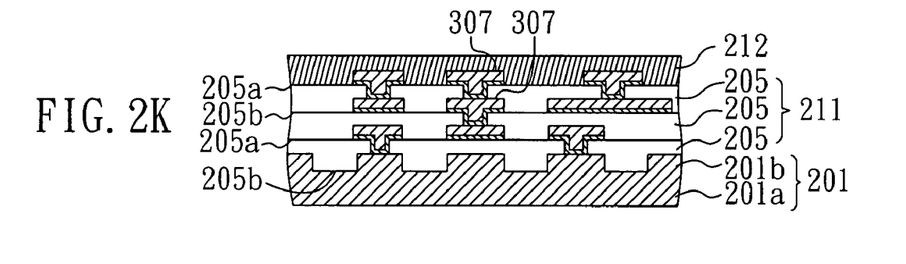
Figure 2L:
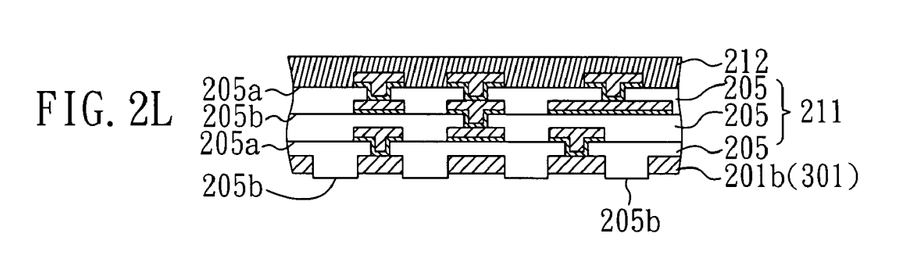
Figure 2M:
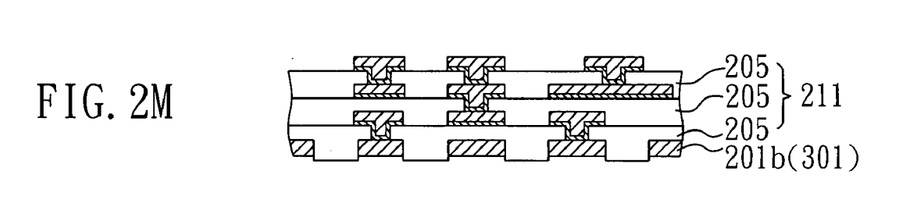
Figure 2N:
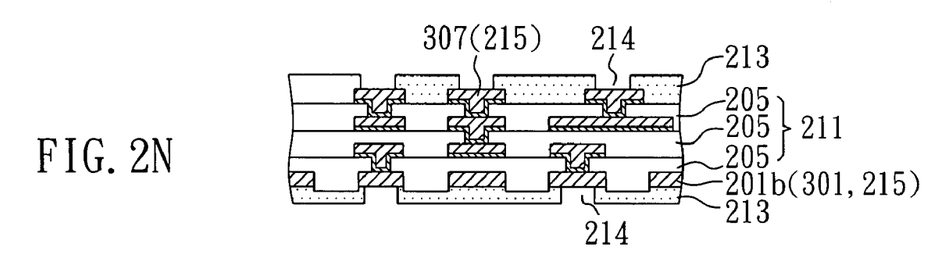
FIGS. 2N' and 2O' are cross-section views of manufacturing a flip-chip package substrate of another preferred embodiment.
Figure 2O:
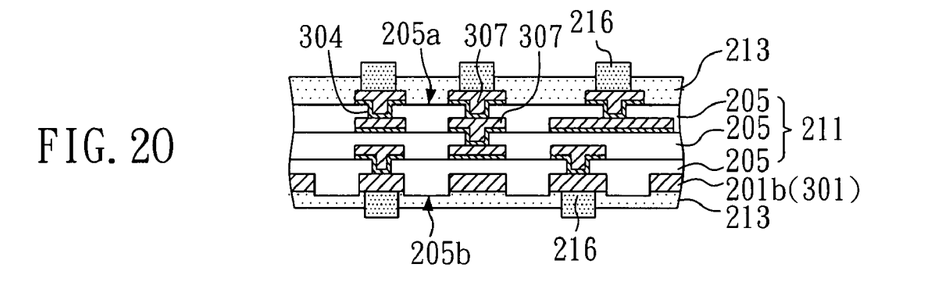

Please refer to FIGS. 2A to 2O, wherein cross-section views of a package substrate without a core-board of a preferred embodiment are shown. As shown in FIG. 2A, a metal carrier plate 201 is provided first. The material of the metal carrier plate 201 is metal, preferably, the material of the metal carrier plate 201 is copper. Subsequently, as shown in FIG. 2B, a resistive layer 202 such as a photosensitive resin layer is formed on the carrier plate and patterned to form plural openings 203 in the resistive layer 202 by exposure and development. Next, as shown in FIG. 2C, plural non-penetrating cavities 204 corresponding to the openings 203 are formed on the carrier plate 201, and thereby the carrier plate 201 has plural protrusions 201b and a base 201a. Then, as shown in FIG. 2D, the first patterned resistive layer 202 is removed.

Subsequently, as shown in FIG. 2E, a dielectric layer 205 is formed on the carrier plate and the non-penetrating cavities. The material of the dielectric layer is selected from the group consisting of non-photosensitive organic resin, a photosensitive organic resin (e.g. ABF (Ajinomoto Build-up Film), BCB (Benzocyclo-buthene), LCP (Liquid Crystal Polymer), PI (Poly-imide), PPE (Poly(phenylene ether)), PTFE (Poly (tetra-fluoro-ethylene)), FR4, FR5, BT (Bismaleimide Triazine), or Aramide), and a mixture of epoxy resin and fiber glass. In the present embodiment, the material of the dielectric layer 205 is ABF. Next, as shown in FIG. 2F, plural vias 206 are formed in the dielectric layer 205 by laser-ablation, or exposure and development. A first conductive layer 207 selected from the group consisting of copper, tin, nickel, chromium, titanium, a copper/chromium alloy, and a tin/lead alloy is formed on the vias 206 and the dielectric layer 205. In the present embodiment, the material of the first conductive layer 207 is copper. Alternatively, a first conductive layer 207 selected from the conductive polymer group consisting of polyacetylene, polyaniline, and organo-sulfur polymer is formed on the vias 206 and the dielectric layer 205. The material of the first conductive layer 207 of the present embodiment is polyacetylene and the conductive layer 207 is formed by spin coating. Next, as shown in FIG. 2G, a resistive layer 208 is formed on the surface of the conductive layer 207 and patterned to form at least one opening 209 corresponding to the vias 206 in the resistive layer 208. Then, as shown in FIG. 2H, an electroplated metal layer (copper) 210 is formed in the openings 209 as the circuit layers 307 of the circuit build-up structure 211. Subsequently, as shown in FIG. 2I, the patterned resistive layer 208 and the conductive layer 207 covered by the patterned resistive layer 208 are removed.

Next, a circuit build-up structure 211 as shown in FIG. 2J is fabricated by repeating the steps of FIGS. 2E to 2I. Then, as shown in FIG. 2K, a resistive layer 212 such as a photosensitive resin layer is formed on the surface of the circuit build-up structure. As shown in FIG. 2L, the base 201a of the metal carrier plate 201 is removed by etching. Subsequently. As shown in FIG. 2M, the resistive layer 212 is removed and thereby an incomplete flip-chip package substrate is provided. Next, as shown in FIG. 2N, a solder mask 213 is individually formed on the upper and the lower surfaces of the incomplete flip-chip package substrate. The solder mask 213 is patterned to form plural openings 214 in the solder mask 213 by exposure and development to expose part of the circuit layers 307 of the circuit build-up structure 211 to function as conductive pads 215, and part of the protrusions 201b to function as conductive pads 215 on the other surface of the circuit build-up structure. Finally, as shown in FIG. 2O, plural solder bumps 216 are formed on the electrical conductor pads 215 on the upper and the lower surfaces of the circuit build-up structure by electroplating or printing. The material of the solder bumps 216 is selected from the group consisting of copper, tin, lead, silver, nickel, gold, platinum, and an alloy thereof. The material of the solder bumps 216 of the present embodiment is tin.

As shown in FIG. 2K. The circuit build-up structure, which comprises at least a dielectric layer 205 and at least a circuit layer 307, wherein each dielectric layer 205 comprises a first surface 205a and a second surface 205b, plural vias 304 are formed in the first surface 205a, the circuit layer 307 is formed on the first surface 205a and in the vias 304 to electrically connect to another circuit layer 307 disposed under the dielectric layer 205. The circuit layer 307 comprises an electroplated metal layer 210 and a conductive layer 207. The material of the electroplated metal layer 210 and the conductive layer 207 shown in this embodiment is copper.

As shown in FIG. 2K and FIG. 2L. The base 201a of the metal carrier plate 201 is removed by etching unless the protrusion 201b to form a metal layer 301. Subsequently, the metal layer 301 embedded in the exposed second surface 205b of the circuit build-up structure 211 without protruding the exposed second surface 205b and connected to the circuit layer 307.

The solder masks 213 disposed on the exposed first surface and the exposed second surface of the circuit build-up structure 211, wherein the solder masks have plural openings to separately expose part of the circuit layer 307 and the metal layer 301 functioning as conductive pads.

The solder bumps 216 disposed on the exposed circuit layer 307 of the solder mask 213 and the metal layer 301.

Embodiment 2

Please refer to FIGS. 2A to 2M and 2N' to 2O', wherein cross-section views of a flip-chip package substrate structure of another embodiment are shown.

An incomplete flip-chip package substrate is provided by repeating the steps of FIGS. 2A to 2M first. Subsequently, as shown in FIG. 2N', metal posts 218 and then solder bumps 216 are formed by electroplating. Preferably, the material of the metal posts 218 is selected from the group consisting of copper, nickel, chromium, titanium, a copper/chromium alloy, and a tin/lead alloy. More preferably, the material of the metal posts 218 is copper. Next, as shown in FIG. 2O', retaining components 219 are respectively disposed around the peripherys of the solder mask 213 to inhibit the bend of the substrate.

Thereby, the present invention resolves the drawbacks of the carrier plate with a core-board, such as low density of circuit layout, excessive layers, long wires, and high resistance. The present invention provides a structure without plating through holes to enhance the density of circuit layout, simplify the process, and reduce the thickness of the loaded substrate. Thus, the present invention meets with the requirement of miniaturization.

Although the present invention has been explained in relation to its preferred embodiment, it is to be understood that many other possible modifications and variations can be made without departing from the spirit and scope of the invention as hereinafter claimed.

What is claimed is:

1. A method for fabricating a flip-chip package substrate, comprising:
    providing a carrier plate;
    forming a patterned resistive layer having plural openings therein on the carrier plate;
    forming plural non-through-penetrating cavities corresponding to the openings on the surface of the carrier plate, and the carrier plate therefore has plural protrusions and a base;
    removing the patterned resistive layer;
    forming at least one circuit build-up structure on the surface of the carrier plate, wherein the circuit build-up structure comprises at least a dielectric layer and at least a circuit layer, and the process for forming the circuit build-up structure comprises: forming a dielectric layer on the carrier plate and the non-through-penetrating cavities, wherein the non-through-penetrating cavities are completely filled with the dielectric layer; forming plural vias in the dielectric layer, and forming a conductive layer on the surface of the dielectric layer and the vias of the dielectric layer; forming a patterned resistive layer on the conductive layer, wherein the patterned resistive layer has plural openings therein and at least one of the openings is located directly above at least one of the vias; forming an electroplated metal layer in the openings; and removing the patterned resistive layer and the conductive layer covered by the patterned resistive layer;

forming a resistive layer on the surface of the circuit build-up structure;

removing the base of the carrier plate;

removing the resistive layer to form an incomplete flip-chip package substrate for receiving semiconductor chip;

forming a first solder mask on an upper surface of the incomplete flip-chip package substrate, and forming a second solder mask on a lower surface of the incomplete flip-chip package substrate;

forming plural first openings in the first solder mask to expose part of the circuit layer of the circuit build-up structure to function as conductive pads, and forming plural second openings in the second solder mask to expose part of the protrusions to function as conductive pads;

forming metal posts on the conductive pads exposed from the first openings and the second openings by electroplating; and forming solder bumps on the metal posts correspondingly.

2. The method for fabricating a flip-chip package substrate as claimed in claim 1, wherein the material of the solder bumps is selected from the group consisting of copper, tin, lead, silver, nickel, gold, platinum, and an alloy thereof.

3. The method for fabricating a flip-chip package substrate as claimed in claim 2, wherein the process for forming the solder bumps is electroplating or printing.

4. The method for fabricating a flip-chip package substrate as claimed in claim 1, further comprising individually disposing a remaining component around the periphery of the first solder mask to inhibit the bend of the substrate.

5. The method for fabricating a flip-chip package substrate as claimed in claim 1, wherein the material of the metal posts is copper.

6. The method for fabricating a flip-chip package substrate as claimed in claim 1, wherein the material of the carrier plate is copper.

7. The method for fabricating a flip-chip package substrate as claimed in claim 1, wherein the material of the electroplated metal layer is copper.

* * * * *